(12) United States Patent
Sweers

(10) Patent No.: US 9,217,811 B1
(45) Date of Patent: Dec. 22, 2015

(54) LIGHTNING DAMAGE INDEX

(75) Inventor: Gregory J. Sweers, Tukwila, WA (US)

(73) Assignee: THE BOEING COMPANY, Chicago, IL (US)

( * ) Notice: Subject to any disclaimer, the term of this patent is extended or adjusted under 35 U.S.C. 154(b) by 592 days.

(21) Appl. No.: 13/327,608

(22) Filed: Dec. 15, 2011

(51) Int. Cl.
*G06F 19/00* (2011.01)
*G01W 1/16* (2006.01)
*B64D 45/02* (2006.01)

(52) U.S. Cl.
CPC . *G01W 1/16* (2013.01); *B64D 45/02* (2013.01)

(58) Field of Classification Search
CPC ...... B64D 45/02; Y02T 50/43; Y02T 50/433; Y02T 50/672; Y02T 50/53; B64C 2001/0072; B64C 1/12; B64C 1/06; B64C 1/36; B64C 2001/0081; B64C 27/006; B64C 27/46; B64C 3/22; H05F 3/00; H05F 3/02
See application file for complete search history.

(56) References Cited

U.S. PATENT DOCUMENTS

| | | | |
|---|---|---|---|
| 3,906,308 A * | 9/1975 | Amason et al. | 361/218 |
| 8,159,369 B1 * | 4/2012 | Koenigs et al. | 340/963 |
| 2005/0046574 A1 * | 3/2005 | Fabian et al. | 340/573.1 |
| 2008/0122424 A1 * | 5/2008 | Zhang et al. | 324/72 |
| 2009/0237272 A1 * | 9/2009 | Georgeson et al. | 340/945 |
| 2011/0049292 A1 * | 3/2011 | Kruckenberg et al. | 244/1 A |

OTHER PUBLICATIONS

William R. Gough, Jan Hemink, Sander Niemeijer, Thomas H. Fahey III, "The Prediction and Occurrence of Aircraft Lightning Encounters at Amsterdam-Schiphol Airport", 47th AIAA Aerospace Science Meeting Including The New Horizons Forum and Aerospace Exposition, Jan. 5-8, 2009, Orlando, Florida.*
DOT/FAA/AR-04/13, "General Aviation Lightning Strike Report and Protection Level Study", Aug. 2004.*
SAE ARP5412 Aircraft Lightning Environment and Related Test Waveforms.*
SAE ARP5414 Aircraft Lightning Zone.*
SAE ARP5416 Aircraft Lightning Test Methods.*
O'Loughlin, "General Aviation Lightning Strike Report and Protection Level Study", Report No. DOT/FAA/AR-04/13, Aug. 2004.*
Gough, et. al, "The Prediction and Occurrences of Aircraft Lightning Encounters at Amsterdam-Schiphol Airport", 47th AIAA Aerospace Sciences Meeting Including the New Horizons Forum and Aerospace Exposition Jan. 5-8, 2009, Orlando, Florida).*

* cited by examiner

*Primary Examiner* — Edward Raymond
(74) *Attorney, Agent, or Firm* — Vista IP Law Group LLP; Cynthia A. Dixon

(57) ABSTRACT

The present disclosure teaches a lightning damage index is that used to predict the propensity of a lightning strike to an aircraft and the degree of damage to the aircraft that the lightning strike will cause. This index can help to obviate operational issues and other losses related to subsequent repairs to the aircraft that are required because of lightning damage. The disclosed method of predicting lightning strike damage to an aircraft involves generating data relating to the aircraft by measuring the dimensions of the aircraft, assessing the design features of the aircraft, and/or obtaining electromagnetic density data associated with regions of the aircraft. The method further involves creating a lightning damage index that provides a numeric representation for predicted lightning strike damage to the aircraft based on the generated data. The numeric representation may be further modified by factors associated with operation of the aircraft.

29 Claims, 4 Drawing Sheets

| Airplane Type | Nose to Wing Root Angle | Winglet | Radome Design (*curve ratio, material, supplemental protection) | Electromagnetic Density, nose (kV/m) | Lightning strike probability, initial attach to nose | Flight Altitude (ft)/Change in strike probability | +Geographic Operating Area/strike probability | #Storm Seasonal effect on strike probability |
|---|---|---|---|---|---|---|---|---|
| Single engine turboprop | 75° | No | High curve, Metalic, No | 150 | 40 | 8000/15% 10000/20% 12000/30% | 2% | None |
| Short haul regional jet, monoplane, jet engine | 30° | No | Med curve, Non-metalic, Yes | 250 | 60 | 8000/15% 10000/20% 12000/30% | 5% | Increase 20% |
| Short haul single-aisle jet airliner, twin engine | 30° | No | Low curve, Non-metalic, Yes | 200 | 50 | 8000/15% 10000/20% 12000/30% | 5% | Increase 20% |
| Narrow body business jet | 45° | No | Med curve, Non-metalic, Yes | 220 | 55 | 8000/15% 10000/20% 12000/30% | 2% | Increase 20% |
| Narrow body business jet | 45° | Yes | Med curve, Non-metalic, Yes | 220 | 45 | 8000/15% 10000/20% 12000/30% | 10% | None |
| Long haul twin aisle, jet airliner, body, twin engine | 45° | No | Low curve, Non-metalic, Yes | 190 | 55 | 8000/15% 10000/20% 12000/30% | 5% | None |
| Long haul, twin aisle, jet airliner, twin engine | 45° | Yes | Low curve, Non-metalic, Yes | 190 | 45 | 8000/15% 10000/20% 12000/30% | 2% | Increase 20% |

* Curve W/H ≈ 1 = Low
* Curve W/H ≈ 2/3 = Med
* Curve W/H ≈ 1/3 = High

Thunderstorm days in the US range from 10 to 100 per year in this model. +Thunderstorm days = 0-20, rating is Low and strike probability is 2%
+Thunderstorm days = 20-80, rating is Med and strike probability is 5%
+Thunderstorm days = 80-100, rating is High and strike probability is 10%
Storm Season = Yes, increase strike probability by 20%
Storm Season = No, no change in strike probability

FIG. 1

LIGHTNING DAMAGE INDEX

BACKGROUND

The present disclosure relates to lightning damage. In particular, it relates to lightning damage indices.

SUMMARY

The present disclosure relates to a method, system, and apparatus for a lightning damage index. In one or more embodiments, the present disclosure teaches a method of predicting lightning strike damage to one or more types of aircraft. The disclosed method involves generating data relating to the one or more types of aircraft by measuring the dimensions of the one or more types of aircraft, assessing the design features of the one or more types of aircraft, and/or obtaining electromagnetic density data associated with regions of the one or more types of aircraft. The method further involves creating an index that provides a numeric representation for predicted lightning strike damage to the one or more types of aircraft based on the generated data.

In one or more embodiments, the index further comprises a numeric representation for predicted lightning strike damage to a specific location on the aircraft based on the generated data. In at least one embodiment, the method further involves modifying the numeric representation with one or more factors relating to the respective one or more types of aircraft. In some embodiments, the method further involves assigning a numeric value to the one or more factors. In one or more embodiments, the method further involves an algorithmic association between the numeric representation with the numeric value of the one or more factors.

In at least one embodiment, the one or more factors comprises a departure frequency of each of the one or more types of aircraft. In some embodiments, the one or more factors comprises a geographic region in which each of the one or more types of aircraft operates. In one or more embodiments, the one or more factors comprises an altitude at which each of the one or more types of aircraft operates. In at least one embodiment, the one or more factors further comprises a frequency of a specific altitude within a constant time at which each of the one or more types of aircraft operates.

In one or more embodiments, the one or more factors comprises a time period during which each of the one or more types of aircraft operates. In at least one embodiment, the time period is a specified calendar time period. In some embodiments, the time period is a seasonal time period. In one or more embodiments, the time period is adjustable.

In at least one embodiment, the method further involves determining an impact level associated with at least one of the one or more types of aircraft, the generated data, and the one or more factors, and modifying at least one of the numeric representation and the one or more factors with the associated impact level. In some embodiments, each impact level is obtained from a table that displays each impact level associated with the respective at least one of the one or more types of aircraft, the generated data, and the one or more factors.

In one or more embodiments, a system for predicting lightning strike damage to one or more types of aircraft involves data generated for each of the one or more types of aircraft comprising dimensions of the one or more types of aircraft, design features of the one or more types of aircraft, and/or electromagnetic density data associated with different areas of the aircraft. In at least one embodiment, the system further involves an index that compiles the data and provides a numeric representation for predicted lightning strike damage to the one or more types of aircraft based on the compilation of the data.

In at least one embodiment, the index further comprises a numeric representation for predicted lightning strike damage to a specific location on the aircraft based on the data. In some embodiments, the system further involves one or more factors that is applied to the numeric representation to modify the numeric representation. In one or more embodiments, each of the one or more factors has a numeric value. In some embodiments, there is an algorithmic association between the numeric representation and the one or more factors. In at least one embodiment, the system further involves one or more impact levels that is associated with at least one of the one or more types of aircraft, the data, and the one or more factors, and that is applied to modify at least one of the numeric representation and the one or more factors.

The features, functions, and advantages can be achieved independently in various embodiments of the present inventions or may be combined in yet other embodiments.

DRAWINGS

These and other features, aspects, and advantages of the present disclosure will become better understood with regard to the following description, appended claims, and accompanying drawings where:

FIG. 1 shows an example embodiment of an index for predicted lightning strike damage to various types of aircraft;

DESCRIPTION

Figure 2:
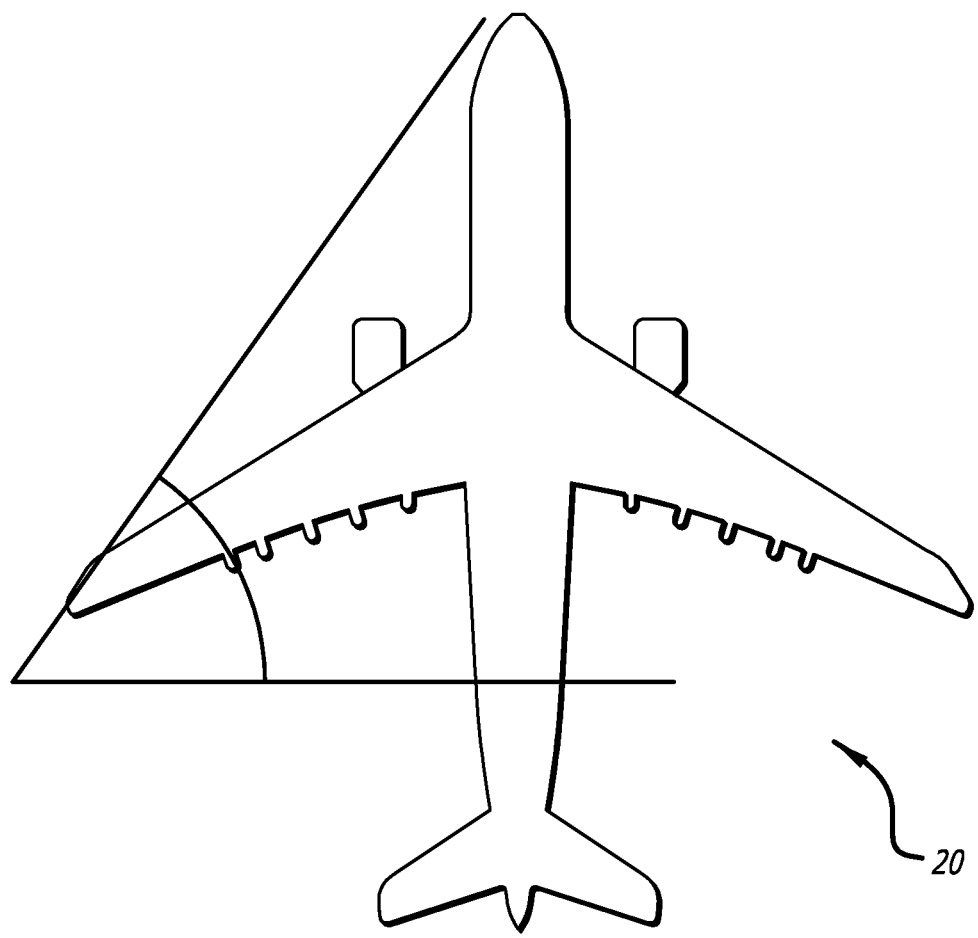
FIG. 2 shows a geometric representation for determining a nose to wing angle on an aircraft.

The methods and apparatus disclosed herein provide an operative system for a lightning damage index. Specifically, this system employs a lightning damage index that is used to predict the propensity of a lightning strike to an aircraft and the location of the strike in order to assess the potential degree of damage to the aircraft that the lightning strike will cause. The lightning damage index can help aircraft operators to predict potential lightning strike damage in an effort to reduce operational burdens and other losses related to subsequent repairs to the aircraft from lightning strikes.

It is possible for aircraft to be struck by lightning while airborne and consequently to incur damage from the lightning strike. However, certain types of aircraft may have designs for which a lightning strike results in more extensive repair needs than other aircraft, which in turn may result in decreased operating time for such aircraft. Such outcomes may lead to customer dissatisfaction due to increased repair costs and limited fleet availability. This can raise issues for aircraft manufacturers that have to provide increased product support to address lightning damage. Aside from the type of aircraft, other factors can contribute to lightning strikes and resulting damage, such as flight frequency, flight altitude, time of year for operating, and geographic area of operation. A system that considers types of aircraft and other contributing factors in predicting lightning strike damage could reduce repair needs and help operators maintain schedules and fleet availability.

The disclosed system design provides an index that allows for predicting potential resulting damage from a lightning strike on an aircraft. The system accounts for multiple aircraft designs and data relating to a lightning strike associated with the respective designs. The system also accounts for contributing factors to lightning strikes, such as flight frequency, flight altitude, time of year for operating, and geographic area of operation.

In the following description, numerous details are set forth in order to provide a more thorough description of the system. It will be apparent, however, to one skilled in the art, that the disclosed system may be practiced without these specific details. In the other instances, well-known features have not been described in detail so as not to unnecessarily obscure the system.

FIG. 1 shows an example of an index 10 that compiles data generated for various types of aircraft and provides numeric representations for predicted lightning strike damage to the various types of aircraft. The lightning strike damage takes into account the likelihood of a lightning strike to the respective aircraft and the area of the aircraft that lightning may strike, which can have a significant impact on the extent of damage. The numeric representations are based on the compiled generated data for the respective types of aircraft. The types of aircraft featured in the index may be selected as desired and based on user criteria. In this example, the aircraft listing is selected based on general features such as hauling distance, engine type, and body type. In other embodiments, the aircraft selected for listing may be based on a specific engine, basis of use (commercial or private), purchasing sector (military or civilian), manufacturer, year produced, or other categories. The number of aircraft selected for the index may range from one to any desired number.

In providing the generated data, the index 10 features dimensional measurements of each aircraft type. This may be used to evaluate and present additional data in the index relating to lightning strike damage to each type of aircraft. In the illustrated embodiment, a measurement of the dimensions of a particular aircraft type provides the nose to wing root angle of the aircraft, which may affect lightning strike damage to the aircraft. A geometric illustration of the nose to wing root angle of an aircraft is shown in FIG. 2. In other embodiments, other aspects of measurements of each aircraft type may be included, such as radome dimensions, wingspan, tail height relative to the nose, and other dimensional features.

Other data in index 10 includes design features that are assessed for each type of aircraft. In the illustrated embodiment, winglet inclusion is a specified design feature, and the index 10 features multiple rows for each type of aircraft to reflect the presence or absence of a winglet, for easier use of the index 10. Radome design for each type of aircraft is also included based on the potential impact of the radome design on lightning strike frequency and lightning strike location on the aircraft. To further illustrate, FIG. 1 shows sample radome curve designs with index 10 featuring width-to-height (W/H) ratios and a scale of low, medium, and high curvature corresponding to the ratios. The scale is incorporated in the index 10 for reference in selecting the appropriate design of the aircraft. In the present embodiment, other features of the radome design are also included, namely, radome material and the presence of supplemental protection. In other embodiments, other design features having a potential impact on lightning strike frequency and lightning strike location on the aircraft may be included, such as engine location, wing design, and aircraft body materials.

Additional data in index 10 includes the electromagnetic densities associated with different areas of the aircraft. The electromagnetic density for a particular area of the aircraft may impact the extent of lightning strike damage to that particular area and/or to the aircraft as a whole. In the illustrated embodiment, the index 10 includes electromagnetic densities associated with the aircraft nose in kilovolts/meter (kV/m). In alternative embodiments, the electromagnetic density may be featured in other units and/or for other areas of the aircraft.

Following the generated data, index 10 provides the numeric representation for predicted lightning strike damage for each type of aircraft. In the illustrated embodiment, the index 10 provides a numeric representation in the form of a probability expressed as a percentage for predicting a lightning strike to each aircraft type and at a particular location on the aircraft, which is the nose in the present embodiment, wherein a higher percentage represents a higher likelihood of a lightning strike to the nose of the aircraft. In alternative embodiments, other numeric representations may be utilized such as: a scale of 1 to 10, with 1 representing a low likelihood and 10 representing a high likelihood of a lightning strike; or a positive and negative scale, with 0 representing normal likelihood of a lightning strike, positive integers representing a higher likelihood, and negative integers representing a lower likelihood (or vice-versa). Also in the illustrated embodiment, the numeric representation for a predicted lightning strike is directed to a specific location on the aircraft. In alternative embodiments, numeric representations for predicted lightning strikes to other parts of the aircraft, such as wings and/or the tail, may also be provided, or the numeric representation may not be limited to a particular location on the aircraft.

The numeric representation may be based upon: an algorithmic relationship derived between the listed features for each aircraft design; empirical data gathered in the course of operation; or a combination of an algorithmic relationship and empirical data. As an example, each particular aircraft design may have a higher or lower likelihood of incurring lightning strikes based on known lightning strike frequency and lightning strike location for that design. For example, in generating the data for the index, operational data may be gathered to show that one type of aircraft incurs a lightning strike on the nose once every 50 flights, while another type of aircraft incurs a lightning strike on the nose once every 100 flights.

The other data presented in the index 10, such as the dimensions and design features of the aircraft, may also serve to modify the numeric representation. For example, operational data may be gathered to indicate that the presence of a winglet increases the likelihood of a lightning strike on the nose by 15%. As another example, operational data may be gathered to indicate that the a 45° nose to wing root angle has no impact on lightning strike frequency and/or damage incurred, while a 30° nose to wing root angle corresponds to a 20% increase in lightning strike frequency with severe damage to the nose. The lightning strike data associated with these probabilities may be tabulated based on an algorithmic relationship (e.g., addition, multiplication) to create a final probability for a lightning strike on the nose, which is presented in the index. In other embodiments, probabilities for a lightning strike on other aircraft locations, such as the wings, may be included.

In an alternative embodiment, each feature in the index 10 may be assigned a numerical value. For example, each aircraft design may be assigned a numerical value based on lightning strike history for the respective design. The design features in the index may also be assigned numerical values based on the known impact of the features on lightning strikes. For example, a winglet for a particular aircraft design may have a value of +3 for increasing the likelihood of a lightning strike on the nose, while a wing to root ratio of 30° for a particular aircraft design may have a value of +5 for also increasing the likelihood of a lightning strike on the nose, such that these become additive effects for determining the numeric representation associated with predicted lightning strike damage, which may be represented as a Lightning Damage Index (LDI).

The numeric representation for predicted lightning strike damage to the aircraft may also be modified by several factors relating to the aircraft. These factors may be operational in nature, such as departure frequency, flight altitude, geographic region in which the aircraft operates, and a selected time period during which the aircraft operates. Data relating to these factors may be generated as appropriate for a user. The combined result of the numeric representation and the modifying factors may be represented collectively in the LDI. As examples of the factors, departure frequency may be provided on a flights per week basis. Geographic location may be provided as countries, navigational coordinates, or user-delineated areas. Altitude may be provided as a general altitude at which an aircraft spends most operating time, or more specifically as a frequency of a specific altitude within a constant time at which an aircraft operates. Time period may be provided as a seasonal period, a calendar period, or any other desired time period. The time period may also be adjustable to reflect specific time periods as needed.

To further illustrate use of the factors in the index 10, first referring to altitude, the index 10 shows three different altitudes for each aircraft type. As examples, altitudes of 8,000 feet (ft), 10,000 ft, and 12,000 ft are provided, but the displayed altitudes may vary as desired. The index 10 also shows the change in lightning strike probability at each altitude for the respective aircraft type.

Figure 4:
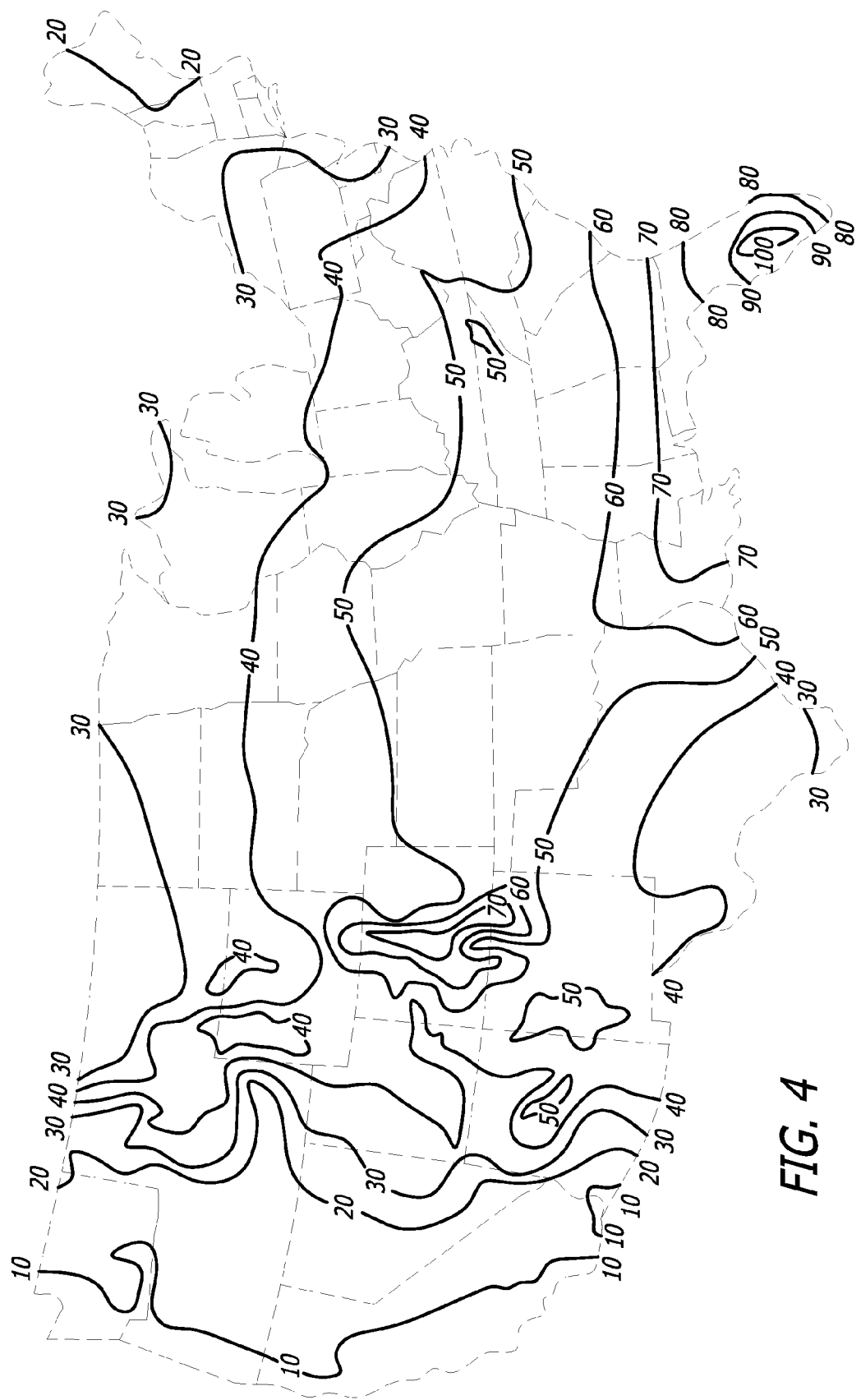
FIG. 4 shows a representative data sampling of thunderstorm days over a geographic area.

Referring to geographic area, the index 10 shows lightning strike days per year for a geographic area and the change in lightning strike probability for aircraft operating in that geographic area. As a base reference, FIG. 4 provides a map showing regions of the U.S. and the number of thunderstorm days per year for those regions in the range of 1 to 100 days. As illustrative examples, Oklahoma has 50 thunderstorm days per year and the west coast of California has 10 thunderstorm days per year. The index 10 shows such representative thunderstorm days and the change in lightning strike probability. In this embodiment, geographic regions with 0-20 thunderstorm days are considered as having a low lightning strike level, so that lightning strike probability is only increased by 2%. Geographic regions with 20-80 thunderstorm days have a medium lightning strike level and increase strike probability by 5%, and geographic regions with 80-100 thunderstorm days have a high lightning strike level and increase strike probability by 10%.

Referring to time period, the index 10 in the illustrated embodiment features a seasonal time period, namely storm season. Here, the index 10 shows the increase in lightning strike probability if an aircraft operates during storm season, wherein there is a 20% increase in lightning strike probability if an aircraft operates during storm season. Other time periods may also be featured, such as calendar time periods or specific operating time periods selected by a user. Multiple time periods may also be included, such that a user may plan for a range of operating times in considering the possibility of lightning strikes on aircraft.

By applying factors that modify the numeric representation, a user may take into consideration conditions that are specific to a particular aircraft to more accurately predict lightning strike damage to that aircraft. For example, a plane that flies in a particular geographic region with inclement weather patterns may be more likely to incur a lightning strike with greater damage than an aircraft that flies in a region with more favorable weather for operation. In this manner, an aircraft operator can plan for certain types of aircraft to have greater availability and require less repair materials and staffing, while at the same time planning for other aircraft to be less available and to have repair materials and crews available for that type of aircraft due to the possibility of lightning strike damage.

In the illustrated embodiment, the factors have a numerical value for modifying the numeric representation of the predicted lightning strike. In particular, the factors may have a numerical value that is consistent with the numeric representation. For example, if the numeric representation for predicted lightning strike damage is expressed as a probability, the numerical values of the factors may also be expressed as a probability. To further illustrate, the index may show that one aircraft type has a 5% probability of incurring lightning strike damage to the nose. However, the geographic region in which a user assigns that aircraft type to operate may have a high frequency of lightning storms, such that the geographic region corresponds with a threefold increase in probability of incurring lightning strike damage to the nose for that type of aircraft. In a further embodiment, there is an algorithmic association between the numeric representation and the factors. In one embodiment, the numeric representation for predicting a lightning strike is presented as a probability, and each factor has a numeric value that is multiplied with the probability.

To expand upon the example above, the 5% probability of incurring lightning strike damage to the nose is multiplied by 3 based on the threefold increase in the probability due to the geographic region, resulting in a 15% probability of incurring lightning strike damage to the nose. In another embodiment, the numerical representation may be totaled with the numeric value of the factors.

To further illustrate, an algorithmic association between the numeric representation and the factors can be represented by the following equation, in which the numeric representation and the factors are represented by probabilities that are multiplied to predict lightning strike damage as represented by the Lightning Damage Index:

$$LDI = NR \times FA \times DF \times GR \times TP$$

wherein LDI=Lightning Damage Index, NR=numeric representation, FA=probability of a lightning strike based on flight altitude, DP=probability of a lightning strike based on departure frequency, GR=probability of a lightning strike based on the geographic region of operation, and TP=time period. In another embodiment, the LDI may be determined from an addition algorithm wherein the numeric representation and the factors are represented by probabilities that are added, such as:

$$LDI = NR + FA + DF + GR + TP$$

In yet another embodiment, the LDI may be determined from an algorithm combining functions, such as:

$$LDI = NR \times FA \times DF \times GR + TP.$$

Other examples of algorithmic relationships may be applied that are suited for predicting lightning strike damage.

In another alternative embodiment, the factors may not have a numerical value but instead may be assigned qualitative representations. For example, an aircraft that has approximately 1200 or more departures a year may have a high likelihood of incurring lightning strike damage, such that a departure frequency range of 1200-1500 departures per year may indicate "very high risk." On the other hand, an aircraft that only has approximately 300 departures a year may have a low likelihood of incurring lightning strike damage, such that a departure frequency range of 200-300 departures per year may indicate "low risk." In this manner, a user may refer to the numeric representation for a predicted lightning strike, and then note that the numeric representation may be modified based on the qualitative data associated with the respective factors.

In another embodiment, one or more impact levels that is respectively associated with one or more of the aircraft type, the data associated with the aircraft, and the factors is applied to modify one or both of the numeric representation for predicting lightning strike damage to the aircraft and the associated factors (e.g., flight altitude). The purpose of applying the impact level is to account for additional considerations for predicting lightning strike damage. To illustrate, considering the factors of altitude and time period, if a particular aircraft flies at a high-risk altitude for a lightning strike during only half of the selected time period, the weight of altitude in predicting lightning strike damage may be reduced. Thus, the impact level associated with altitude may be assigned a numeric value, such as −50%, that is applied in an algorithmic relationship to the respective factor. To illustrate, expanding on one of the example algorithmic relationships represented by the equations above, the impact levels may be incorporated with the factors as follows:

$$LDI = NR \times K_1 FA \times K_2 DF \times K_3 GR \times K_4 TP$$

wherein $K_1$=the impact level associated with flight altitude, $K_2$=the impact level associated with departure frequency, $K_3$=the impact level associated with geographic region, and $K_4$=the impact level associated with time period. The impact levels may be: constants based on empirical data or other information; variables based on data and/or functions; or both. To provide other examples, in one embodiment, the impact levels are assigned values such that the impact levels have a total value of one. In another embodiment, the impact levels are integers with values based on empirical data.

In an alternative embodiment, the impact level may be expressed qualitatively, such as in "decreased risk." In one embodiment, the impact levels are presented in a table to associate the respective aircraft, generated data, and modifying factors with the appropriate impact level. The impact levels may be derived from operational data, scientific research, or other sources.

By using the system with index featuring the numeric representation for predicted lightning strike damage, the modifying factors, and the impact levels, a user may prepare for lightning strike damage to an aircraft while considering the conditions under which the aircraft operates. For example, if a certain aircraft is known to fly a route at an altitude at which lightning strike damage is expected to increase, the operator can have maintenance crews and materials ready at the aircraft destination points for any necessary repairs. The operator may also plan to have additional aircraft available for flying that specific route, should lightning strike damage remove other aircraft from operation. An aircraft operator can also refer to the index to select aircraft that is less likely to incur lightning strike damage in order to select aircraft with a low propensity for incurring lightning strike damage to fly in conditions with elevated lightning activity, e.g., certain geographic areas or during specific time periods. Likewise, an aircraft operator can select aircraft with a high propensity for incurring lightning strike damage to fly in conditions with low lightning activity. As such, a user can use the data as needed and has a wide range of optional considerations in predicting lightning strike damage to an aircraft and thus optimizing the aircraft equipment selection and configuration using particular LDI for the operating equipment design and conditions.

In one embodiment, a computer processor is used to generate the index 10 and the selected factors and impact levels. As an example, a user may access the computer processor and command the processor to generate the index 10. The user may input data as desired in the index 10, wherein the computer processor includes a database for accessing data associated with the user inputs, e.g., numerical values associated with lightning strike damage for aircraft design features, such as winglets and with the factors, such as altitude and geographic area. The computer processor then processes the inputs to complete the index and provide a numeric representation associated with the aircraft type, as well as the LDI that is based on any selected factors and associated impact levels. In this manner, the user may manipulate inputs to obtain various predictions for lightning strike damage and subsequently plan operations based on the information generated from the computer processor through the index 10.

Figure 3:
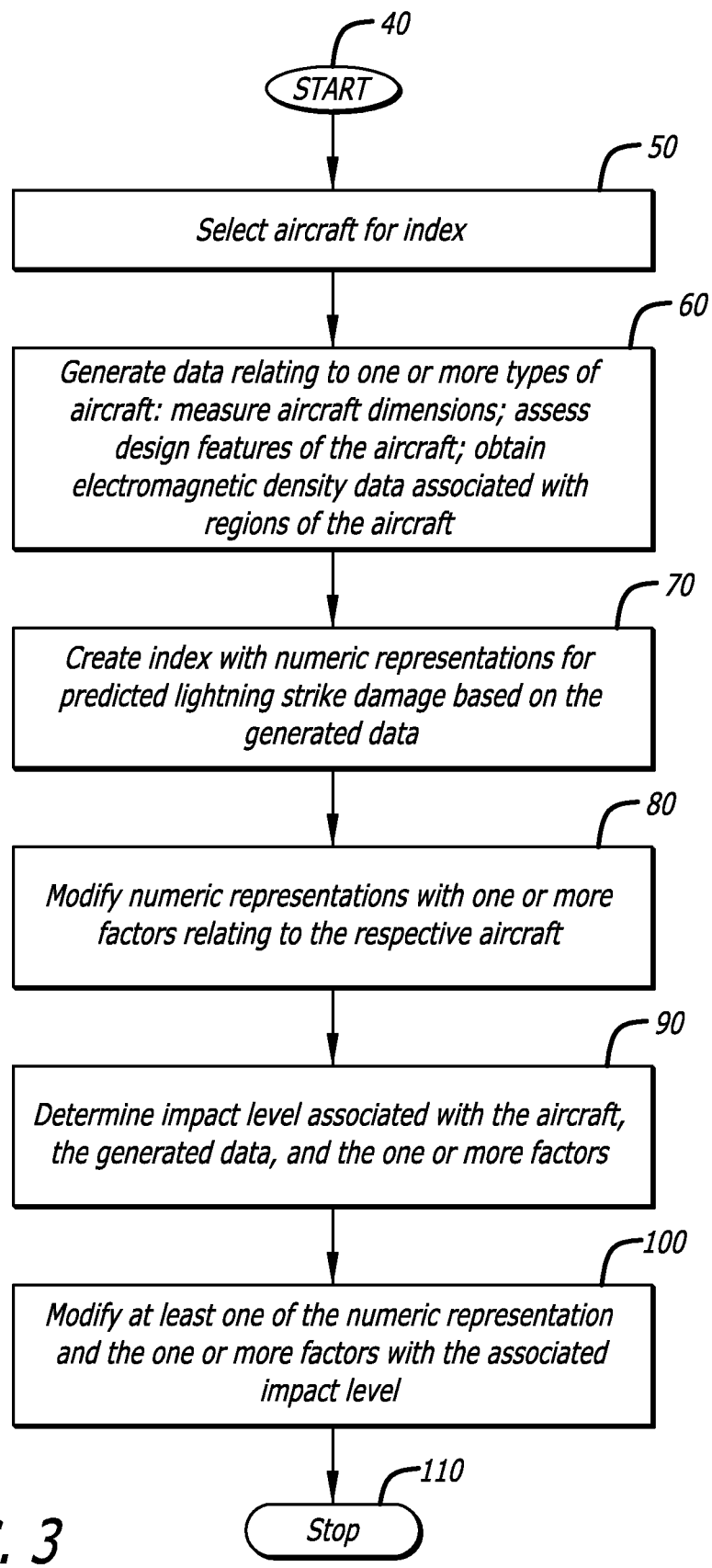
FIG. 3 shows a method of creating an embodiment of the index of FIG. 1.

Having described a system for predicting lightning strike damage to one or more types of aircraft, a method of predicting lightning strike damage to one or more types of aircraft will now be described. Referring to FIG. 3, the method is started (step 40) by selecting one or more types of aircraft for which lightning strike damage is to be predicted are selected (step 50). Data relating to the aircraft is then generated by measuring the dimensions of the aircraft, assessing the design features of the one or more types of aircraft (e.g., winglets), and obtaining electromagnetic density data associated with regions of the one or more types of aircraft (step 60). An index is then created that provides a numeric representation for predicted lightning strike damage to the one or more types of aircraft based on the generated data (step 70). The numeric representation may be directed to predicting lightning strike damage to a specific location on the aircraft.

In one embodiment, the numeric representation may also be modified with one or more factors relating to the aircraft, such as departure frequency, geographic region of operation, flight altitude, and/or time period of operation (step 80). The factors may be assigned numeric values, which may further have an algorithmic relationship with the numeric representation for predicting lightning strike damage. Alternatively, the factors may be expressed qualitatively (i.e., "high risk" or "low risk"). In a further embodiment, an impact level is determined that is associated with one or more of the aircraft, the generated data, and the modifying factors (step 90). The impact level may be obtained from a table that displays each impact level associated with the respective aircraft, generated data, and modifying factors. The impact level may then be used to modify one or both of the numeric representation and the factors (step 100). The method may then be completed (step 110).

Although certain illustrative embodiments and methods have been disclosed herein, it can be apparent from the foregoing disclosure to those skilled in the art that variations and modifications of such embodiments and methods can be made without departing from the true spirit and scope of the art disclosed. Many other examples of the art disclosed exist, each differing from others in matters of detail only. Accordingly, it is intended that the art disclosed shall be limited only to the extent required by the appended claims and the rules and principles of applicable law.

I claim:

1. A method of predicting lightning strike damage to one or more types of aircraft, comprising:
generating data relating to the one or more types of aircraft by:

measuring the dimensions of the one or more types of aircraft, assessing the design features of the one or more types of aircraft, and obtaining electromagnetic density data associated with regions of the one or more types of aircraft; and generating, by a computer processor, an index that provides a numeric representation for predicted lightning strike damage to the one or more types of aircraft based on the generated data.

2. The method of claim 1, wherein the index further comprises a numeric representation for predicted lightning strike damage to a specific location on the aircraft based on the generated data.

3. The method of claim 1, the method further comprising modifying the numeric representation with one or more factors relating to the respective one or more types of aircraft.

4. The method of claim 3, further comprising assigning a numeric value to the one or more factors.

5. The method of claim 4, further comprising an algorithmic association between the numeric representation with the numeric value of the one or more factors.

6. The method of claim 3, wherein the one or more factors comprises a departure frequency of each of the one or more types of aircraft.

7. The method of claim 3, wherein the one or more factors comprises a geographic region in which each of the one or more types of aircraft operates.

8. The method of claim 3, wherein the one or more factors comprises an altitude at which each of the one or more types of aircraft operates.

9. The method of claim 8, wherein the one or more factors further comprises a frequency of a specific altitude within a constant time at which each of the one or more types of aircraft operates.

10. The method of claim 3, wherein the one or more factors comprises a time period during which each of the one or more types of aircraft operates.

11. The method of claim 10, wherein the time period is a specified calendar time period.

12. The method of claim 10, wherein the time period is a seasonal time period.

13. The method of claim 10, wherein the time period is adjustable.

14. The method of claim 3, further comprising determining an impact level associated with at least one of the one or more types of aircraft, the generated data, and the one or more factors, and modifying at least one of the numeric representation and the one or more factors with the associated impact level.

15. The method of claim 14, wherein each impact level is obtained from a table that displays each impact level associated with the respective at least one of the one or more types of aircraft, the generated data, and the one or more factors.

16. A system for predicting lightning strike damage to one or more types of aircraft, comprising:

data generated for each of the one or more types of aircraft comprising:

dimensions of the one or more types of aircraft, design features of the one or more types of aircraft, and electromagnetic density data associated with different areas of the aircraft; and an index that compiles the data and provides a numeric representation for predicted lightning strike damage to the one or more types of aircraft based on the compilation of the data.

17. The system of claim 16, wherein the index further comprises a numeric representation for predicted lightning strike damage to a specific location on the aircraft based on the data.

18. The system of claim 16, further comprising one or more factors that is applied to the numeric representation to modify the numeric representation.

19. The system of claim 18, wherein each of the one or more factors has a numeric value.

20. The system of claim 19, wherein there is an algorithmic association between the numeric representation and the one or more factors.

21. The system of claim 18, wherein the one or more factors comprises a departure frequency for each of the one or more types of aircraft.

22. The system of claim 18, wherein the one or more factors comprises a geographic region in which each of the one or more types of aircraft operates.

23. The system of claim 18, wherein the one or more factors comprises an altitude at which each of the one or more types of aircraft operates.

24. The system of claim 23, wherein the one or more factors comprises a frequency of a specific altitude within a constant time at which each of the one or more types of aircraft operates.

25. The system of claim 18, wherein the one or more factors comprises a time period during which each of the one or more types of aircraft operates.

26. The system of claim 25, wherein the time period is a specified calendar time period.

27. The system of claim 25, wherein the time period is a seasonal time period.

28. The system of claim 25, wherein the time period is adjustable.

29. The system of claim 18, further comprising one or more impact levels that is associated with at least one of the one or more types of aircraft, the data, and the one or more factors, and that is applied to modify at least one of the numeric representation and the one or more factors.

* * * * *